United States Patent [19]

Bok et al.

[11] Patent Number: 5,669,971
[45] Date of Patent: Sep. 23, 1997

[54] SELECTIVE COATING APPARATUS

[75] Inventors: Hendrick F. Bok, Fairhaven, Mass.; William Richard Johnson; Joseph Patrick O'Connor, both of Carmel, Ind.; Matthew Martin Shade; Lamar Duane Young, both of Indianapolis, Ind.

[73] Assignee: Specialty Coating Systems, Inc., Indianapolis, Ind.

[21] Appl. No.: 557,381

[22] Filed: Nov. 13, 1995

Related U.S. Application Data

[63] Continuation of Ser. No. 223,646, Apr. 6, 1994, abandoned.

[51] Int. Cl.[6] ........................................... B05C 5/00
[52] U.S. Cl. ........................... 118/300; 118/313; 118/315
[58] Field of Search ..................... 118/300, 313, 118/315; 427/600, 601, 96; 347/46, 1; 239/4, 102.2, 596, 601

[56] References Cited

U.S. PATENT DOCUMENTS

| | | | |
|---|---|---|---|
| 3,556,411 | 1/1971 | Nord et al. | 239/581 |
| 3,843,055 | 10/1974 | Nord et al. | 239/601 |
| 3,858,812 | 1/1975 | Williams et al. | 239/599 |
| 3,923,253 | 12/1975 | Stewart | 239/463 |
| 4,326,553 | 4/1982 | Hall | 134/153 |
| 4,346,849 | 8/1982 | Rood | 239/597 |
| 4,349,947 | 9/1982 | Rood | 29/157 |
| 4,485,388 | 11/1984 | Sayko | 346/140 |
| 4,578,290 | 3/1986 | Komon et al. | 427/421 |
| 4,600,601 | 7/1986 | Tamura | 427/96 |
| 4,695,482 | 9/1987 | Weiswurm | 427/96 |
| 4,698,240 | 10/1987 | Ono et al. | 427/58 |
| 4,751,529 | 6/1988 | Elrod et al. | 346/140 R |
| 4,751,530 | 6/1988 | Elrod et al. | 346/140 R |
| 4,753,819 | 6/1988 | Shimada | 427/96 |
| 4,842,887 | 6/1989 | Bolte | 427/10 |
| 4,906,326 | 3/1990 | Amemiya et al. | 156/626 |
| 4,922,269 | 5/1990 | Ikeda et al. | 346/140 |
| 5,059,266 | 10/1991 | Yamane et al. | 156/64 |
| 5,111,220 | 5/1992 | Hadimioglu et al. | 346/140 R |
| 5,191,354 | 3/1993 | Quate | 347/46 |
| 5,266,349 | 11/1993 | Bok | 427/8 |

FOREIGN PATENT DOCUMENTS 0230782  12/1986  European Pat. Off. .

OTHER PUBLICATIONS

Wesley Irenson Liquid Solden Jetting Attracts US Research Assembly Mar. 1994.

Better Resolution with Inkjet Plotters, Diane Orlando, Alan Cariffe, Hewlett–Packard Co., Palo Alto, Calif., pp. 91–92.

Acoustic Pump. Langley Research Center, Hampton, Virginia, Oct. 1990.

*Primary Examiner*—Laura Edwards
*Attorney, Agent, or Firm*—Wolf, Greenfield & Sacks, P.C.

[57] ABSTRACT

Apparatus and methods for selectively coating the surfaces of objects are disclosed. The apparatus comprises a plurality of megasonic transducers which generate acoustical pressure waves in the megasonic frequency range in an upward direction and cause droplets of coating material to be expelled from a supply of the liquid coating material which is disposed above the transducers. The droplets travel in a generally upward direction toward the surface of the object to be coated which is held in an inverted, i.e., downward position.

8 Claims, 3 Drawing Sheets

SELECTIVE COATING APPARATUS

This is a continuation of application Ser. No. 08/223,646, filed Apr. 6, 1994, now abandoned.

FIELD OF THE INVENTION

The present invention relates to apparatus and methods for coating objects. More specifically, the present invention relates to apparatus and methods for selectively coating objects, e.g., printed wiring boards, with a liquid coating material.

BACKGROUND OF THE INVENTION

It is often desirable to coat the surfaces of objects, e.g., printed wiring boards, with coating materials for various reasons, such as, for example, to enhance corrosion resistance or electrical insulation resistance. When coating printed wiring boards for example, in some cases the entire surface of the board can be coated. In other cases, it is necessary to provide a coating on only certain areas on the surface of the printed wiring board. This is commonly the case where further operations, e.g., soldering, need to be made on the board. Thus, in such instances, it is typically required to leave electrical contacts, adjustment screws, test points, heat sinks, and the like, uncoated.

Although selective coating can be achieved by masking the areas of the printed wiring board which are to remain uncoated and then subjecting the board to a complete coating method, such as spray coating or dip coating for example, such methods involving masking are often time consuming and costly.

Other selective coating apparatus and methods are known whereby liquid coating material is dispensed from an apparatus in a downward direction, either in the form of a continuous stream or in the form of droplets, and intermittently contacted with the surface of the printed wiring board. Such apparatus often provide acceptable results for coating the surfaces of objects. However, gravitational forces can cause the coating material to flow onto undesired areas on the printed wiring board before the coating material is cured (known in the art as "flow-out").

Accordingly, new apparatus and methods are desired for selectively coating the surfaces of objects, e.g., printed wiring boards, in order to achieve a high degree of coating selectivity and precision and reduce the flow-out of the coating material prior to curing.

SUMMARY OF THE INVENTION

By the present invention, apparatus and methods for selectively coating the surfaces of objects with a liquid coating material are provided. In accordance with the apparatus and methods of the present invention, megasonic transducers are utilized to generate acoustical pressure waves in a generally upward direction through a supply of a liquid coating material in order to form droplets of the coating material which are expelled in an upward direction and contacted with the surface of the object to be coated. The surface of the object to be coated is disposed in a generally inverted orientation, i.e. downward orientation.

The apparatus and methods of the present invention can provide a high degree of coating selectively and precision, e.g., areas as small as 0.1 inch by 0.1 inch can be left uncoated. Thus, the methods and apparatus provide the flexibility to leave electrical contacts, adjustment screws, test points, heat sinks, and the like, uncoated. Moreover, since the surface of the object to be coated is disposed in an inverted orientation, the gravitational effects which can cause flow-out of the coating material onto undesired areas are eliminated.

DETAILED DESCRIPTION OF THE INVENTION

Figure 1:
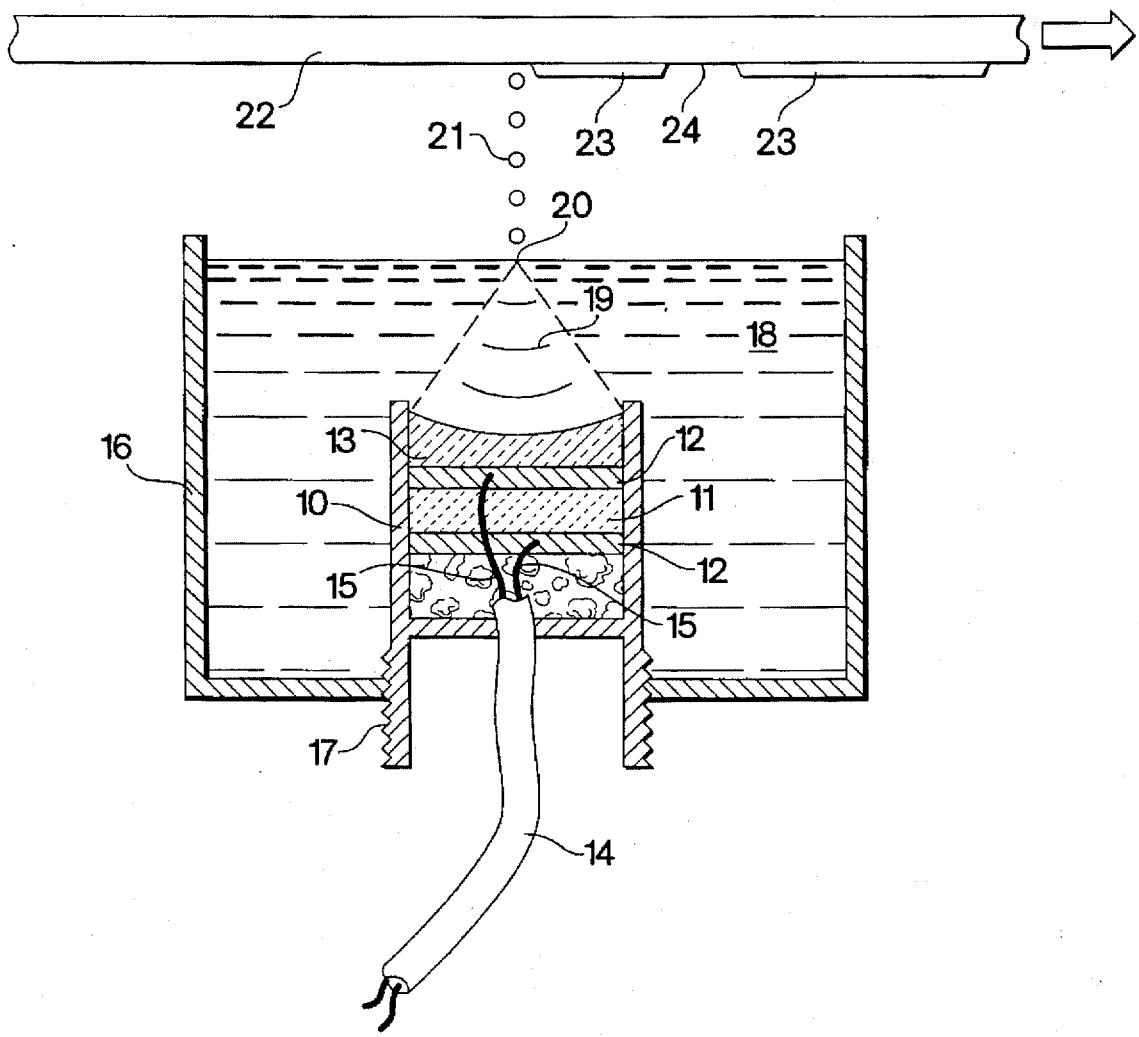
FIG. 1 is a side view schematic of a transducer in accordance with the present invention.

The transducers suitable for use in accordance with the present invention are capable of generating acoustical pressure waves in the megasonic frequency range. Preferably, the frequency range, which is also known in the art as the oscillation frequency or the excitation frequency, ranges from about 5 to 7 megahertz ("MHz"). More preferably, the frequency range is from about 5.5 to 6.5 MHz.

Preferably, each transducer comprises a housing, a crystal element and a lens.

Preferably, the housing has an open top end which is at least partially open and a bottom end which is at least partially closed.

The crystal elements suitable for use in the transducers of the present invention are those which exhibit a mechanical response to an electrical stimulus in the megasonic frequency range. Preferably, the crystal element has a top side and a bottom side and is disposed in the housing with the top side oriented towards the top end of the housing. It is preferred that the crystal element is comprised of a substrate material selected from the group consisting of ceramics, composites of ceramics, other piezoelectric materials known to those skilled in the art, and mixtures thereof. Preferred crystal elements are ceramic compositions containing a modified lead zirconate-titanate material, which is commercially available, for example, from Keramos Inc., Indianapolis, Ind. It is further preferred that the crystal element is coated on at least one of the top side and the bottom side, and more preferably on both the top side and the bottom side, with a conductive material, such as, for example, metal, a conductive adhesive or semiconductor. Electrical leads connected to a voltage source, as described further herein, are preferably connected to the conductive top side and the conductive bottom side of the crystal element in order to transfer electricity to the crystal to cause it to vibrate.

Preferably, the lens is disposed in the housing above and in immediate proximity to the crystal element. More preferably, the lens is a concave lens which can function in order to focus the acoustical pressure waves generated by the transducer at a desired focal point above the top end of the transducer. The lens may be comprised of any material through which the acoustical pressure waves can pass. Materials suitable for use as lens, e.g., glass and polypropylene, are known to those skilled in the art. Alternatively, those skilled in the art will recognize that the acoustical pressure waves may be focused by means other than a lens, such as, for example, by using a physical means to reflect the pressure waves toward a focal point, e.g., a cone shaped physical barrier.

The transducer may also comprise a cover which does not substantially obstruct the pathway of the acoustical pressure waves. Preferably, such a cover when used has either a flat or a convex shape in order to prevent the collection of dirt particles and other foreign matter inside the depression of the concave lens.

Typically, the crystal and lens are imbedded in the housing along with any wires, and the like, with a suitable adhesive material, e.g., epoxy. This imbedding technique is also known in the art as potting.

Further details concerning transducers suitable for use in accordance with the present invention are known to those skilled in the art.

Preferably, the apparatus of the present invention comprises from about 4 to 200 transducers and more preferably, from about 50 to 100 transducers. The transducers are preferably positioned within the apparatus on a generally horizontal plane in a grid pattern i.e., an array. In addition, it is preferred that the grid pattern comprises a series of rows and columns with each of said rows comprising transducers in line with each other and each of said columns comprising transducers which are offset from each other. For example, a typical apparatus in accordance with the present invention may contain 10 rows of transducers with 8 transducers in each row, i.e., 8 columns. In this case, in any given column, the transducers in each successive row may be offset relative to the transducers in the previous row a certain distance, e.g., by 0.1 inch. The center to center distance between each successive transducer in a given row is preferably constant, e.g., 1 inch. Thus, throughout the length of one column, a band width of 1 inch of coating material could be applied to the surface of an object.

Preferably, the transducers are housed in one or more reservoirs which are adapted to hold the transducers in the reservoir such that they are removable and adjustable, both for elevation and rotation, and such that they can be submerged in the liquid coating material. More preferably, a separate reservoir is provided for each row of transducers. Preferably, each reservoir is adapted to hold from about 1 to about 20 transducers. Vertical adjustment within the housing enables the focal point of the acoustical pressure waves to be adjusted. Rotational adjustment within the reservoir allows for compensation for acoustical pressure waves which do not propagate in a completely vertical direction from the transducer.

The apparatus further comprises a means for positioning the object such that the surface of the object can face in a generally downward direction and be disposed above one or more of the transducers. Such means may comprise for example, a conveyor belt or chain with edge hanging fingers which can move the object transversely in a generally horizontal direction above and across the rows of transducers, e.g., parallel to the columns. In addition, it is also preferred that the apparatus comprise a means for advancing the objects in a generally horizontal direction, laterally and above the transducers, i.e., parallel to the rows. Another means for positioning the object may, for example, comprise a magnetic chuck or holding device.

The indexing of the object during the advancement is preferably computer controlled and may also be accomplished through the use of stepper motors and encoders or by continuous movement. The advancement speed of the object across the transducers is typically in the range of about 0.1 to 60 inches per minute, often from about 1 to 20 inches per minute. The distance of the surface of the object above the top end of the transducers is typically in the range of about 0.1 to 10 inches and preferably in the range of about 0.2 to 2 inches.

Further details concerning the means for positioning the object and for advancing and indexing the object, are known to those skilled in the art.

The apparatus further comprises a means for providing a supply of the liquid coating material above the transducers and in the pathway of the acoustical pressure waves. Preferably, this is accomplished by submerging the transducers in a bath of the liquid coating material. Alternatively, those skilled in the art will recognize that other means for providing a supply of the liquid coating material above the transducers are possible within the scope of the present invention. For example, individual reservoirs for the coating material in an upper portion of the housing can be provided wherein liquid coating material can be pumped to all of the transducer housing reservoirs by suitable pumping and tubing means, which are known to those skilled in the art.

Preferably, the upper level of the liquid coating material is maintained at a height which corresponds approximately to the focal point of the acoustical pressure waves. Thus, typically the height of the liquid level will be maintained within about plus or minus 0.05 inch, preferably within plus or minus 0.01 inch, more preferably within plus or minus 0.005 inch and most preferably within plus or minus 0.0025 inch of the focal point of the transducer in question. The focal point of the acoustical pressure waves depends on various factors, such as, for example, the properties of the liquid coating material, the shape of the lens, etc., which factors are known to those skilled in the art. Moreover, techniques for determining the focal point of a particular transducer are known to those skilled in the art.

In accordance with the present invention, the level of the liquid coating material is preferably maintained in each reservoir at the desired level by providing a liquid circulation system, e.g., appropriate pumps and tubing, and a level control means, e.g., a stand pipe or weir. Details concerning apparatus and methods for liquid level control are known to those skilled in the art.

The apparatus further comprises a means for introducing energy to each of the transducers, which energy is sufficient to cause the transducers to generate the acoustical pressure waves and cause droplets of the liquid coating material to be expelled from the supply of the liquid coating material in a generally upward direction toward the surface of the object. In order to generate the droplets, an appropriate form of energy, e.g., electrical energy, is introduced to the transducer in order to cause the crystal element to vibrate in a megasonic frequency range, e.g., from about 4 to 7 MHz and preferably from about 5.5 to 6.5 MHz. Since the crystal elements, e.g., ceramic crystals, may have slightly different characteristics, it is often desirable to adjust the vibration frequency and duration of excitation of each crystal individually in order to achieve the desired expulsion profile of droplets from the supply of the liquid coating material. The scope of the present invention is also intended to include any other form of energy, e.g., magnetic energy, suitable to create the desired frequency vibrations.

In the case of electrical energy, typically each transducer will require a power input of from about 2 to 10 watts, preferably from about 4 to 7 watts. Typically, direct current ("DC") voltage in the range of from about 0 to 500 volts, preferably from about 70 to 100 volts, is used. Preferably, the DC voltage is modulated at the vibration frequency of the transducer. This energy is applied to the transducer for a given period of time, i.e., burst width, typically ranging from about 0 to 500 microseconds, preferably from about 200 to 300 microseconds. The repeating period of the burst widths can range from 0, i.e., when no power is applied, to continuous duty, i.e., when power is applied continuously. Typically, the repeating period ranges from about 0 to 100 hertz ("Hz"). The repeating period is equal to the desired number of droplets to be expelled from the supply of liquid coating material on a per second basis. For example, if the repeating period is 100 Hz, then when the transducer is energized 100 droplets per second will be expelled from the supply of the liquid coating material. The above described technique for generating megasonic vibrations by electrical excitation means is known in the art as the piezoelectric effect.

The particular electrical hardware, computer hardware, computer control logic, gating circuitry, and the like, are not critical to the present invention and are known to those skilled in the art. However, one preferred method for generating the megasonic vibrations in the transducers of the present invention is as follows: A computer or process control device utilizing a shift register provides an on or off bit signal corresponding to each transducer, e.g. 80 bytes for 80 transducers. The bit signal is provided in response to a program corresponding to the desired coating pattern on the surface of the object. Such program can be generated by any means known to those skilled in the art, e.g., by a paint brush type program such as Windows Paintbrush sold by Microsoft Corporation, Redmond, Wash., or by optically scanning the surface of the object to be coated such as described in U.S. Pat. No. 5,266,349, issued Nov. 30, 1993. The output from the shift register is sent to a pulse generator which generates a pulse preferably in a square wave form in response to the bit signal. The number of pulses generated in a given amount of time is determined in accordance with the program on a per second basis, i.e., the repeating period noted above. Alternatively the timing of the pulse generation can be synchronized with the movement of the object to be coated across the transducers. The length of each pulse, i.e., the burst width noted above, can also be determined in accordance with the program. The output from the pulse generator is passed to a frequency generator which generates the signal frequency. The output from the frequency generator is sent to an amplifier where the signal is amplified to the desired transducer power output, e.g., 4 to 7 watts. The output from the amplifier is then sent to the respective transducer. Further details concerning methods such as the preferred method described above are known to those skilled in art.

Preferably the acoustical pressure waves are sufficient to cause droplets of the liquid coating material to be expelled from the supply of a liquid coating material in an essentially vertical direction, e.g., with a spread of less than about plus or minus 10°. Typically, the size of the droplets will range from about 0.001 to 0.125 inches in diameter, preferably from about 0.040 to 0.060 inches in diameter. The upward distance which the droplets travel can be controlled by regulating the power input to each transducer, as well as the viscosity and surface tension of the liquid, for example. Preferably, the height of the expulsion profile of the droplets will range from about 0 to 12 inches and more preferably from about 1 to 5 inches above the surface of the liquid coating material.

In accordance with the present invention, each transducer can be turned on and off as desired in order to coat selected areas on the surface of the object. In addition, when the transducers are configured in an offset grid pattern such as described above, complete coverage of the surface of the object can be achieved if desired. In addition, those skilled in the art will recognize that by varying the repeating period, power input and advancement speed of the object relative to the transducers, the thickness and band width of the coating can be precisely controlled. Typically, the band width of coating material from a single transducer in accordance with the present invention will be from about 0.005 to 0.25 inches, preferably, from about 0.007 to 0.15 inches and more preferably, about 0.10 inches.

The liquid coating materials are not critical to the present invention. However, the apparatus of the present invention are particularly suitable for use with viscous coating materials. Typically, the viscosity of the coating materials will be at least 10 centipoise ("cp") and range from about 10 to 1000 cp., preferably from about 50 to 600 cp. Typical coating materials include solvent based and aqueous based materials, as well as solvent free and carrier free materials known in the art as 100% solids materials. The solids portion of the coating materials is also not critical to the present invention and can comprise materials such as, for example, polyimides, polyurethanes, acrylics, silicones, and epoxies, as well as others known to those skilled in the art. Further details concerning suitable coating materials for use in accordance with the apparatus and methods of the present invention are known to those skilled in the art.

The particular objects suitable for coating with the apparatus and methods of the present invention are not critical. However, the apparatus and methods are particularly suitable for coating objects having rigid, flat or curved planar surfaces such as, for example, circuit boards, wafers and other electronic hardware. Quite advantageously, the apparatus and methods of the present invention can be used to selectively coat objects which have protrusions, e.g., electronic devices, extending therefrom.

The apparatus and methods of the present invention are hereinafter described with reference to the drawings. The drawings are presented for illustrative purposes and are not intended to limit the scope of the claims which follow. Those skilled in the art will recognize that the drawings are schematic representations of only certain elements and thus do not illustrate many common elements known to those skilled in the art, such as, for example, motors, computers, switches, frames, control devices and the like.

FIG. 1 illustrates the functioning of a transducer in accordance with the present invention to coat a printed wiring board. The transducer is comprised of a housing 10, a ceramic crystal element 11 having metalized surfaces 12 on the top side and bottom side, and a concave polypropylene lens 13. The transducer also comprises an electrical wire 14 containing two leads 15 attached to the metalized surfaces 12 of crystal element 11. The transducer is removably and adjustably mounted for both elevation and rotation in a reservoir 16 via threading means 17. A liquid coating material 18, e.g., 100% solids epoxy, is contained within reservoir 16.

In the operation of the transducer, electrical energy such as, described above, is introduced to crystal element 11 in order to cause crystal element 11 to vibrate in the megasonic frequency range. Acoustic pressure waves 19 are generated by the megasonic vibrations propagated through the liquid coating material and focused by lens 13 to a focal point 20 which is at or near the surface of liquid 18. The acoustical pressure waves cause droplets of coating material 21 to be expelled from the surface of the liquid in an upward direction toward object 22. The electrical energy supplied to crystal element 11 is turned on and off in order to selectively provide coating material to coated areas 23 and leave other selected areas 24 uncoated.

Figure 2:
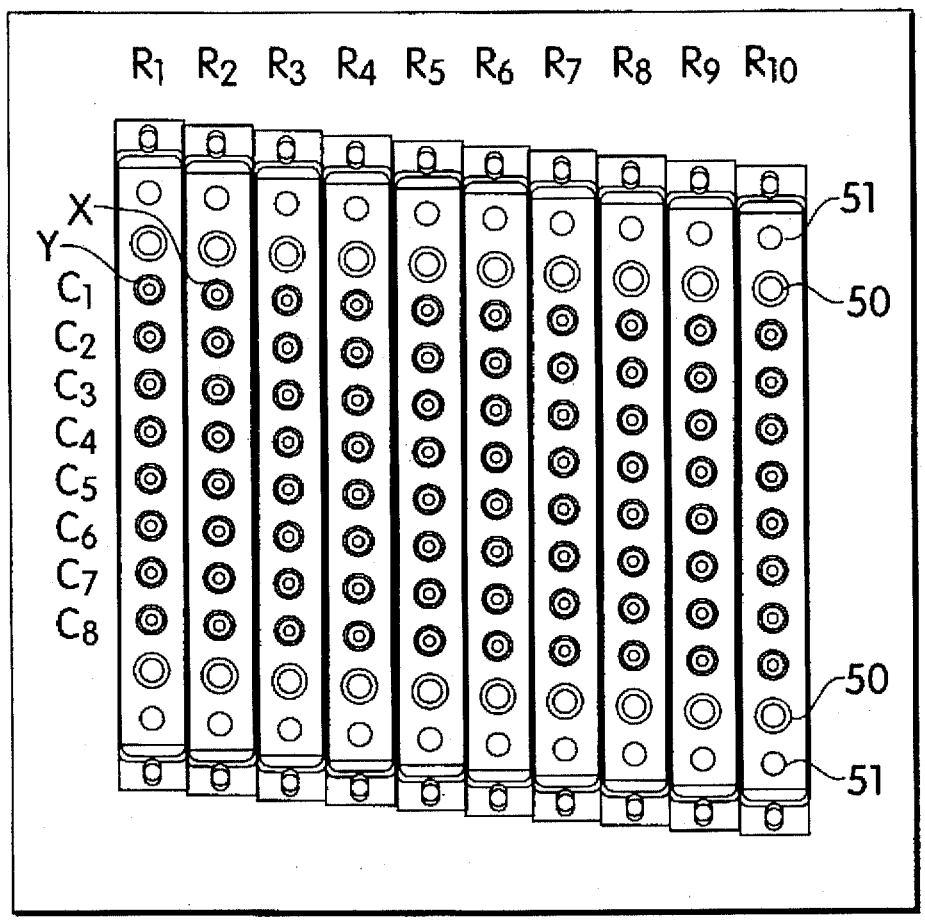
FIG. 2 is an overhead view of an offset grid pattern of an array of transducers in accordance with the present invention.

FIG. 2 is a top view schematic of an array of transducers suitable for use in accordance with the apparatus of the present invention. Ten rows, i.e., $R_1$ to $R_{10}$, are shown. Each row of transducers is contained in a separate reservoir. Eight columns of transducers, i.e. $C_1$ to $C_8$ are also shown. A transducer X in position $C_1R_2$ is shown to be offset from transducer Y in position $C_1R_1$. By offsetting each successive transducer in each column, it is possible to provide continuous coverage of the coating material on the surface of the object. Also illustrated in FIG. 2, are feed tubes 50 for supplying the liquid coating material to each reservoir and stand pipes 51 for maintaining the level of liquid coating material in each reservoir.

Figure 3:
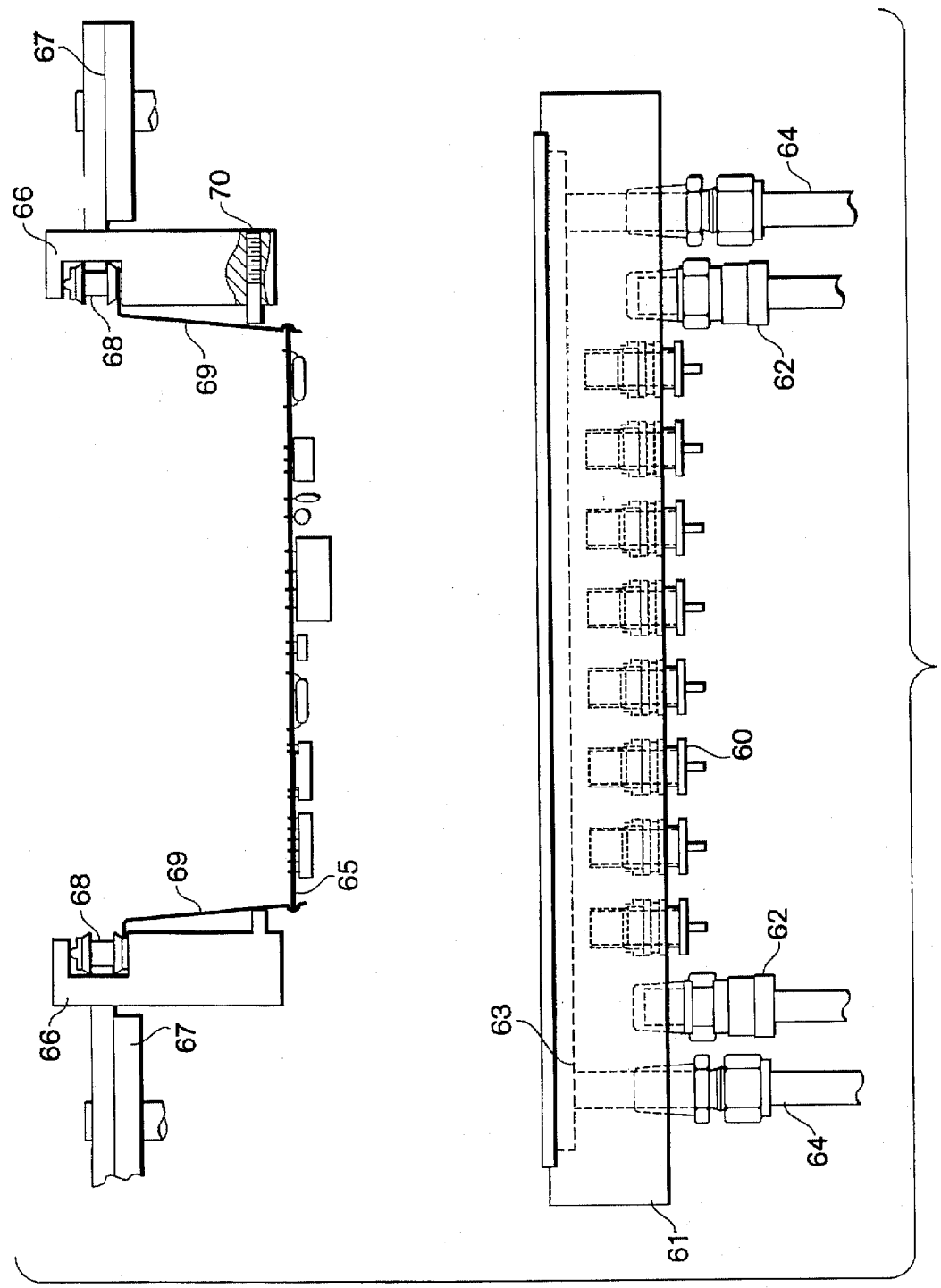
FIG. 3 is an end view schematic of a conveyor and a row of transducers in accordance with the present invention.

FIG. 3 is an end view schematic of a row of transducers and a conveyor suitable for use in accordance with the present invention. Eight transducers 60 are shown in the row. Each of the transducers is removably and adjustably mounted in reservoir 61. Liquid coating material is supplied through inlet 62 and maintained at a level 63 by stand pipe 64.

A printed wiring board 65 is held in an inverted orientation on a variable width conveyor track having a stationery track 66, a drive sprocket 67 engaged with a chain 68 and fingers 69 which are attached to the chain. A spring loaded finger backup mechanism 70 is also provided in order to apply lateral pressure to finger 69 for holding printed wiring board 65 in place. As printed wiring board 65 traverses the row of transducers, each transducer 60 turns on and off at desired times to provide coating material on desired locations on the board.

Although the present invention has been described with respect to specific aspects, those skilled in the art will recognize that the other aspects are intended to be included within the scope of the claims which follow. For example, more or less transducers than specifically described herein can be used in the apparatus of the present invention. In addition, the transducers may be laid out in a different orientation than the grid pattern described herein. Moreover, the transducers may be mounted at different elevations from each other or may be positioned to intentionally expel the droplets at an angle.

We claim:

1. Apparatus for selectively coating a surface of an object with a coating material comprising:

a plurality of individual transducers disposed in a row in a generally horizontal plane, each transducer being capable of generating acoustical pressure waves in a generally upward direction, an elongate reservoir for receiving a liquid coating material, said liquid coating material having an upper surface;

means for mounting each of said transducers in said reservoir such that said transducers are submerged beneath the surface of said liquid coating material, each of said transducers comprising a housing have an open top, a crystal element mounted in said housing for generating acoustical pressure waves upwardly, and a lens element mounted in said housing above said crystal element for focusing said acoustical pressure waves at a focal point in the vicinity of the upper surface of the liquid coating material, each of said mounting means being operative for permitting adjustment of a vertical elevation of said transducer, and adjustment of a rotational alignment of said transducer;

means for maintaining a constant liquid level of said liquid coating material in said reservoir;

means for selectively supplying electrical energy to each of said transducers, said energy being sufficient to cause said transducers to generate acoustical pressure waves and cause droplets of said coating material to be expelled form the surface of said coating material; and means for advancing an object in a generally horizontal direction above said reservoir.

2. The apparatus of claim 1, wherein said means for mounting each of said transducers comprises an inwardly threaded opening in a bottom wall of said reservoir and an outwardly threaded cylindrical neck portion of said housing, said threaded neck being threadedly received in said threaded opening.

3. A transducer array comprising:

a plurality of individual, independent transducers;

means for selectively supplying electrical energy to each of said transducers, said energy being sufficient to cause said transducers to generate acoustical pressure waves;

a reservoir for receiving a liquid coating material, said liquid coating material having an upper surface;

means for mounting each of said transducers in said reservoir such that said transducers are submerged beneath the surface of said liquid coating material and said acoustical pressure waves are directed toward the upper surface of said liquid coating material, said means for mounting being operative for permitting adjustment of a vertical elevation of said transducer, said means for mounting further permitting adjustment of a rotational position of said transducer relative to said reservoir; and means for maintaining a constant liquid level of said liquid coating material in said reservoir.

4. The transducer array of claim 3 wherein each of said transducers comprises a housing having an open top, a crystal element mounted in said housing for generating acoustical pressure waves upwardly, and a lens element mounted in said housing above said crystal element for focusing said acoustical pressure waves.

5. The transducer array of claim 4 wherein said means for mounting comprises an inwardly threaded opening in a bottom wall of said reservoir and an outwardly threaded cylindrical neck portion of said housing of said transducer, said threaded neck being threadedly received in said threaded opening.

6. Apparatus for selectively coating a surface of an object with a coating material comprising:

a plurality of individual, independent transducers;

means for selectively suppling electrical energy to each of said transducers;

a reservoir for receiving a liquid coating material, said liquid coating material having an upper surface;

means for mounting each of said transducers in said reservoir such that said transducers are submerged beneath the surface of said liquid coating material, said means for mounting being operative for permitting adjustment of a vertical elevation of said transducer so as to adjust a focal point of said acoustical pressure waves adjacent the upper surface of said liquid coating material whereby said acoustical pressure waves cause droplets of said coating material to be expelled from the surface of said coating material, said means for mounting being further operative for permitting adjustment of a rotational alignment of said transducer with respect to the reservoir;

means for maintaining a constant liquid level of said liquid coating material in said reservoir; and means for advancing an object in a generally horizontal direction above said reservoir whereby said expelled droplets are received onto a downwardly facing surface of said object.

7. The selective coating apparatus of claim 6 wherein each of said transducers comprises a housing having an open top, a crystal element mounted in said housing for generating acoustical pressure waves upwardly, and a lens element mounted in said housing above said crystal element for focusing said acoustical pressure waves.

8. The selective coating apparatus of claim 7, wherein said means for mounting said transducer comprises an inwardly threaded opening in a bottom wall of said reservoir and an outwardly threaded cylindrical neck portion of said housing, said threaded neck being threadedly received in said threaded opening.

* * * * *